United States Patent
Narayan et al.

(10) Patent No.: US 6,881,983 B2
(45) Date of Patent: Apr. 19, 2005

(54) EFFICIENT LIGHT EMITTING DIODES AND LASERS

(75) Inventors: Jagdish Narayan, Raleigh, NC (US);
Jinlin Ye, South Easton, MA (US);
Schang-Jing Hon, Attleboro, MA (US);
Ken Fox, Clinton, MA (US); Jyh Chia Chen, Ellicott City, MD (US); Hong K. Choi, Sharon, MA (US); John C. C. Fan, Brookline, MA (US)

(73) Assignee: Kopin Corporation, Taunton, MA (US)

( * ) Notice: Subject to any disclaimer, the term of this patent is extended or adjusted under 35 U.S.C. 154(b) by 28 days.

(21) Appl. No.: 10/207,649

(22) Filed: Jul. 26, 2002

(65) Prior Publication Data

US 2003/0160246 A1 Aug. 28, 2003

Related U.S. Application Data

(63) Continuation-in-part of application No. 10/083,703, filed on Feb. 25, 2002.

(51) Int. Cl.⁷ .............................................. H01L 33/00
(52) U.S. Cl. ........................................ 257/94; 257/103
(58) Field of Search .................................. 257/94, 103

(56) References Cited

U.S. PATENT DOCUMENTS

| | | | |
|---|---|---|---|
| 4,153,905 A | 5/1979 | Charmakadze et al. |
| 4,495,514 A | 1/1985 | Lawrence et al. |
| 4,670,088 A | 6/1987 | Tsaur et al. |
| 4,946,548 A | 8/1990 | Kotaki et al. |
| 4,966,862 A | 10/1990 | Edmond |
| 5,091,333 A | 2/1992 | Fan et al. |
| 5,210,051 A | 5/1993 | Carter, Jr. |
| 5,239,188 A | 8/1993 | Takeuchi et al. |
| 5,247,533 A | 9/1993 | Okazaki et al. |
| 5,252,499 A | 10/1993 | Rothschild |
| 5,272,108 A | 12/1993 | Kozawa |
| 5,278,433 A | 1/1994 | Manabe et al. |
| 5,281,830 A | 1/1994 | Kotaki et al. |
| 5,285,078 A | 2/1994 | Mimura et al. |
| 5,290,393 A | 3/1994 | Nakamura |
| 5,306,662 A | 4/1994 | Nakamura et al. |
| 5,323,022 A | 6/1994 | Glass et al. |
| 5,334,277 A | 8/1994 | Nakamura |
| 5,369,289 A | 11/1994 | Tamaki et al. |
| 5,385,862 A | 1/1995 | Mooustakas |
| 5,406,123 A | 4/1995 | Narayan |
| 5,408,120 A | 4/1995 | Manabe et al. |
| 5,433,169 A | 7/1995 | Nakamura |
| 5,442,205 A | 8/1995 | Brasen et al. |
| 5,468,678 A | 11/1995 | Nakamura et al. |
| 5,516,731 A | 5/1996 | Toutounchi et al |
| 5,563,422 A | 10/1996 | Nakamura et al. |
| 5,578,839 A | 11/1996 | Nakamura et al. |

(Continued)

FOREIGN PATENT DOCUMENTS

| DE | 33 45 172 A1 | 7/1985 |
|---|---|---|
| EP | 0 356 059 A2 | 2/1990 |
| EP | 0483688 B1 | 10/1991 |

(Continued)

OTHER PUBLICATIONS

Dovidenko, K., et al., "Aluminum nitride films on different orientations of sapphire and silicon," *J. Appl. Phys.* 79(5): 2439–2445, (1996).

(Continued)

*Primary Examiner*—Douglas A. Wille
(74) *Attorney, Agent, or Firm*—Hamilton, Brook, Smith & Reynolds, P.C.

(57) ABSTRACT

An optoelectronic device such as an LED or laser which produces spontaneous emission by recombination of carriers (electrons and holes) trapped in Quantum Confinement Regions formed by transverse thickness variations in Quantum Well layers of group III nitrides.

16 Claims, 10 Drawing Sheets.

U.S. PATENT DOCUMENTS

| | | | |
|---|---|---|---|
| 5,637,530 A | 6/1997 | Gaines et al. | |
| 5,652,434 A | 7/1997 | Nakamura et al. | |
| 5,686,738 A | 11/1997 | Moustakas | |
| 5,733,796 A | 3/1998 | Manabe et al. | |
| 5,734,182 A | 3/1998 | Nakamura et al. | |
| 5,747,832 A | 5/1998 | Nakamura et al. | |
| 5,751,752 A | 5/1998 | Shakuda | |
| 5,767,581 A | 6/1998 | Nakamura et al. | |
| 5,777,350 A | 7/1998 | Nakamura et al. | |
| 5,828,684 A | 10/1998 | Van de Walle | |
| 5,834,326 A | 11/1998 | Miyachi et al. | |
| 5,850,410 A | 12/1998 | Kuramata | |
| 5,877,558 A | 3/1999 | Nakamura et al. | |
| 5,880,486 A | 3/1999 | Nakamura et al. | |
| 5,905,276 A | 5/1999 | Manabe et al. | |
| 5,959,307 A | 9/1999 | Nakamura et al. | |
| 5,998,925 A | 12/1999 | Shimizu et al. | |
| 6,001,669 A | 12/1999 | Gaines et al. | |
| 6,017,774 A | 1/2000 | Yuasa et al. | |
| 6,051,849 A | 4/2000 | Davis et al. | |
| 6,066,861 A | 5/2000 | Höhn et al. | |
| 6,069,440 A | 5/2000 | Shimizu et al. | |
| 6,078,063 A | 6/2000 | Nakamura et al. | |
| 6,084,899 A | 7/2000 | Shakuda | |
| 6,093,965 A | 7/2000 | Nakamura et al. | |
| 6,115,399 A | 9/2000 | Shakuda | |
| 6,153,010 A | 11/2000 | Kiyoku et al. | |
| 6,172,382 B1 | 1/2001 | Nagahama et al. | |
| 6,204,512 B1 | 3/2001 | Nakamura et al. | |
| 6,215,133 B1 | 4/2001 | Nakamura et al. | |
| 6,222,871 B1 * | 4/2001 | Chang-Hasnain et al. | 372/96 |
| 6,238,943 B1 * | 5/2001 | Kobayashi et al. | 438/31 |
| 6,245,259 B1 | 6/2001 | Höhn et al. | |
| 6,249,012 B1 | 6/2001 | Manabe et al. | |
| 6,337,493 B1 | 1/2002 | Tanizawa et al. | |
| 6,362,017 B1 | 3/2002 | Manabe et al. | |
| 6,495,862 B1 * | 12/2002 | Okazaki et al. | |
| 6,555,457 B1 * | 4/2003 | Derkits, Jr. et al. | 438/597 |
| 2001/0022367 A1 | 9/2001 | Nakamura et al. | |
| 2001/0030318 A1 | 10/2001 | Nakamura et al. | |
| 2001/0032976 A1 * | 10/2001 | Ishikawa et al. | 257/14 |
| 2002/0046693 A1 | 4/2002 | Kiyoku et al. | |
| 2002/0060326 A1 | 5/2002 | Manabe et al. | |
| 2002/0182765 A1 * | 5/2002 | Tran et al. | |

FOREIGN PATENT DOCUMENTS

| | | |
|---|---|---|
| EP | 0483688 A2 | 10/1991 |
| EP | 0 513 745 A2 | 11/1992 |
| JP | 54-093380 | 7/1979 |
| JP | 59-228776 | 12/1984 |
| JP | 61-056474 | 3/1986 |
| JP | 02-229475 | 9/1990 |
| JP | 2229475 | 9/1990 |
| JP | 03-203388 | 9/1991 |
| JP | 03-218625 | 9/1991 |
| JP | 03-252177 | 11/1991 |
| JP | 04-068579 | 3/1992 |
| JP | 4209577 | 7/1992 |
| JP | 4236478 | 8/1992 |
| JP | 04-242985 | 8/1992 |
| JP | 05-243614 | 9/1993 |
| JP | 06-021511 | 1/1994 |
| JP | 06-177423 | 6/1994 |
| JP | 06-268259 | 9/1994 |
| JP | 8167735 | 6/1996 |
| JP | 8213692 | 8/1996 |
| JP | 8306643 | 11/1996 |
| JP | 8306958 | 11/1996 |
| JP | 8316527 | 11/1996 |
| JP | 52-028887 | 3/1997 |
| JP | 9092880 | 4/1997 |
| JP | 9134881 | 5/1997 |
| JP | 9167857 | 6/1997 |
| JP | 11145513 | 5/1999 |
| WO | WO 88/00392 | 1/1988 |

OTHER PUBLICATIONS

Jain, S.C., et al., "Applied Physics Reviews/III—nitrides: Growth, characterization, and properties," *J. Appl. Phys.* 87(3) : 965–1006, (2000).

Lin, Y.S., et al., "Dependence of composition fluctuation on indium content in InGaN/GaN multiple quantum wells," *Appl. Phys. Lett.*, 77(19) : 2988–2990, (2000).

Narukawa, Y., et al., "Dimensionality of excitons in laser–diode structures composed of $In_xGa_{1-x}N$ multiple quantum wells," *Phys. Rev. B*, 59(15) : 10283–10288, (1999).

Kawakami, Y., et al., "Dynamics of optical gain in $In_xGa_{1-x}N$ multi–quantum–well–based laser diodes," *Appl. Phys. Lett.*, 77(14) : 2151–2153, (2000).

Strite, S., and Morkoc, H., et al., "GaN, AlN, and InN: A review," *J. Vac. Sci. Technol. B*, 10(4) :1237–1266, (1992).

Hassan, K.M., et al., "Optical and structural studies of Ge nanocrystals embedded in AlN matrix fabricated by pulsed laser deposition," *Appl. Phys. Lett.*, 75(9) : 1222–1224, (1999).

Teng, C.W., et al., "Quantum confinement of $E_1$ and $E_2$ transitions in Ge quantum dots embedded in an $Al_2O_3$ or an AlN matrix," *App. Phys. Lett.*, 76(1) : 43–45, (2000).

Narukawa, Y., et al., "Role of self–formed InGaN quantum dots for exciton localization in the purple laser diode emitting at 420 nm," *Appl. Phys. Lett.*, 70(8) : 981–983, (1997).

Nakamura, S., "The Roles of Structural Imperfections in InGaN–Based Blue Light–Emitting Diodes and Laser Diodes," *Science*, 1–14, (retrieved online Aug. 08, 2000). Retrieved from the Internet <URL: http://www.science.org/cgi/content/full/281/5379/956>.

Chichibu, S., et al., "Spatially resolved cathodoluminescence spectra of InGaN quantum wells," *App. Phys. Lett.*, 71(16) : 2346–2348, (1997).

Foresi, J.S., "Metel contacts to gallium nitride," *Appl. Phys. Lett.*, 62(22):2859–2861 (1993).

Nakamura, S., "InGaN blue–light–emitting diodes," *J. of Inst. Electronics, Information and Communication Engineers*, 76(9):913–917 (1993). (Abstract).

Akasaki, I., et al., "High efficiency UV and blue emitting devices prepared by MOVPE and low energy electron beam irradiation treatment," *SPIE—The International Society for Optical Engineering*, 1361:138–149 (1990).

Amano, H., et al., "P–Type Conduction in Mg–Doped GaN Treated with Low–Energy Electron Beam Irradiation (LEEBI)," *Japanese Journal of Applied Physics*, 28(12):L2112–L2114 (1989).

Andreev, V.M., et al., "Luminescence Properties of i–n, i–n–i and n–i–n Structures Made of Epitaxial Layers GaN/α–$Al_2O_3$," *Journal of Luminescence*, 35:9–16 (1986).

Boulou, M., et al., "Recombination Mechanisms in GaN:Zn*," *Journal of Luminescence*, 18/19:767–770 (1979).

Casey, H.C., Jr., et al., "Optical Fields and Wave Propagation," In *Heterostructure Lasers*, (Academic Press), pp. 32–35 (1978).

Goldenberg, B., et al. "Ultraviolet and violet light–emitting GaN diodes grown by low–pressure metalorganic chemical vapor deposition," *Appl. Phys. Lett.*, 62(4):381–383 (1993).

Goodenough, F., "Exotic Semiconductors Showcased at the IEDM," *Electronic Design*, 60–68 (1994).

Hayashi, I, et al., "Junction Lasers Which Operate Continuously at Room Temperature," *Appl. Phys. Lett.*, 17(3):109–111 (1970).

Jacob, G., et al., "GaN Electroluminescent Devices: Preparation and Studies," *J. of Luminescence*, 17:263–282 (1978).

Jang, J.S., et al., "High Quality Non–Alloyed Pt Ohmic Contacts to P–Type GaN Using Two–Step Surface Treatment," *MRS Internet J. Nitride Semiconductor Res., F99W10.4*.

Kaminska, E., et al., "Ni/Si–Based Contacts to GaN: Thermally Activated Structural Transformations Leading to Ohmic Behavior," *MRS Internet J. Nitride Semicond. Res. 4S1, G9.9*.

Kampen, T.U., et al., "Metal Contacts on a GaN," *MRS Internet Journal of Nitride Semiconductor Research*, 1(41).

Madar, R., et al., "High Pressure Solution Growth of GaN$_+$," *J. of Crystal Growth*, 31:197–203 (1975).

Matsuoka, T., et al., "Growth and Properties of a Wide–Gap Semiconductor InGaN," *Optoelectronics*, 5(1):53–64 (1990).

Matsuoka, T., "Current status of GaN and related compounds as wide–gap semiconductors," *J. of Crystal Growth*, 124:433–438 (1992).

Nakamura, S., et al., "High–power InGaN/GaN double–heterostructure violet light emitting diodes," *Appl. Phys. Lett.*, 62(19):2390–2392 (1993).

Nakamura, S., et al., "P–GaN/N–InGaN/N–GaN Double-Heterostructure Blue–Light–Emitting Diodes," *Jpn. J. Appl. Phys.*, 32:L8–L11 (1993).

Nakamura, S., "Growth of In$_x$Ga$_{(1-x)}$N compound semiconductors and high–power InGaN/AlGaN double heterostructure violet–light–emitting diodes," *Microelectronics Journal*, 25:651–659 (1994).

Nakamura, S., et al., "High–Power GaN P–N Junction Blue–Light–Emitting Diodes," *Japanese Journal of Applied Physics*, 30(12A):L1998–L2001 (1991).

Nakamura, S., "InGaN/AlGaN Double–Heterostructure Blue Leds," *Mat. Res. Soc. Symp. Proc.*, 339:173–178 (1994).

Nakamura, S., et al., "Thermal Annealing Effects on P–Type Mg–Doped GaN Films," *Jpn. J. Appl. Phys.*, 31(2)(2B):L139–L142 (1992).

Nakamura, S., "Zn–doped InGaN growth and InGaN/AlGaN double–heterostructure blue–light–emitting diodies," *J. of Crystal Growth*, 145:911–917 (1994).

Nakamura, S., et al., "High–brightness InGaN/AlGaN double–heterostructure blue–green–light–emitting diodes," *J. Appl. Phys.*, 76(12):8189–8191 (1994).

Nakamura, S., et al., "Cd–Doped InGaN Films Grown on GaN Films," *Jpn. J. Appl. Phys.*, 32(2)(3A):L338–L341 (1993).

Nakamura, S., "High Power InGaN/AlGaN Double–Heterostructure Blue–Light–Emitting Diodes," *IEEE*, 22.1.1–22.1.4 (1994).

Piotrowska, A., et al., "Ohmic Contacts to III–V Compound Semiconductors: A Review of Fabrication Techniques," *Solid–State Electronics*, 26(3):179–197 (1983).

Sporken, R., et al., "XPS study of Au/GaN and Pt/GaN contacts," *MRS Internet Journal of Nitride Semiconductor Research*, 2(23) (1997).

Venugopalan, H.S., et al., "Phase Formation and Morphology in Nickel and Nickel/Gold Contacts to Gallium Nitride," [online] [retrieved on Jul. 22, 2002]. Retrieved from the Internet http:/nsr.mij.mrs.org/MRS/S97–D/4.10/.

Zhou, L., et al., "Characteristics of Ti/Pt/Au Ohmic Contacts on p–type GaN/Al$_{1-x}$N Superlattices," *MRS Internet J. Nitride Semicond. Res. F99W10.3*.

Chichibu, S. et al., "Exiton localization in InGaN quantum well devices", *J. Va. Sci. Technol. B*, 16(4): 2204–2214, Jul./Aug. 1998.

Chen Lu, et al., "Fabrication of 50–100 nm Patterned InGaN Blue Light Emitting Heterostructures", *IEEE* vol. 1 of 2: 760–761, (2001).

Cho H.K., et al., "Influence of strain–induced indium clustering on characteristics of InGaN/GaN multiple quantum wells with high indium composition", *Journal of Applied Physics*, 91(3): 1104:1107, Feb. 1, 2002.

Narayan, J., et al., "Effect of thickness variation in high–efficiency InGaN/GaN light–emitting diodes", *Applied Physics Letters*, 81(5): 841–843, Jul. 29, 2002.

\* cited by examiner

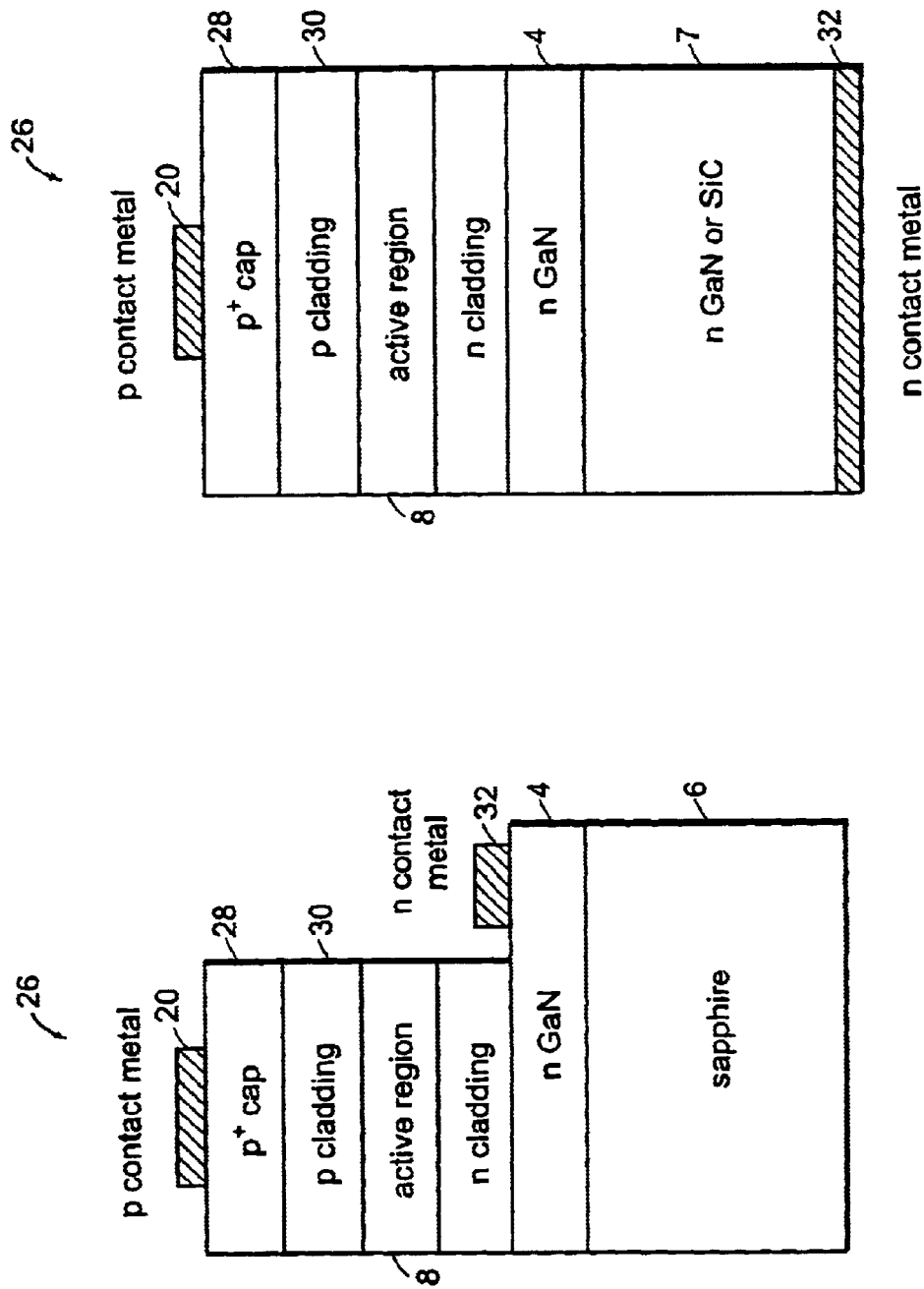

EFFICIENT LIGHT EMITTING DIODES AND LASERS

RELATED APPLICATION(S)

This application is a continuation-in-part of U.S. application Ser. No. 10/083,703, filed Feb. 25, 2002, of which the entire teachings is incorporated herein by reference.

BACKGROUND OF THE INVENTION

Light emitting diodes ("LEDs") are p-n junction devices that have been found to be useful in various roles as the field of optoelectronics has grown and expanded over the years. Devices that emit in the visible portion of the electromagnetic spectrum have been used as simple status indicators, dynamic power level bar graphs, and alphanumeric displays in many applications, such as audio systems, automobiles, household electronics, and computer systems, among many others. Infrared devices have been used in conjunction with spectrally matched phototransistors in optoisolators, hand-held remote controllers, and interruptive, reflective, and fiber-optic sensing applications.

An LED operates based on the recombination of carriers (electrons and holes) in a semiconductor. When an electron in the conduction band combines with a hole in the valence band, it loses energy equal to the bandgap of the semiconductor in the form of an emitted photon; i.e., light. The number of recombination events under equilibrium conditions is insufficient for practical applications but can be enhanced by increasing the minority carrier density.

The minority carrier density is conventionally increased by forward biasing the diode. The injected minority carriers recombine with the majority carriers within a few diffusion lengths of the junction edge, generating photons at a wavelength corresponding to the bandgap energy of the semiconductor.

As with other electronic devices, there exists both the desire and need for more efficient LEDs, and in particular, LEDs that will operate at higher intensity while using less power. Higher intensity LEDs, for example, are particularly useful for displays or status indicators in various high ambient environments. High efficiency LEDs with lower power consumption, for example, are particularly useful in various portable electronic equipment applications. An example of an attempt to meet this need for higher intensity, lower power, and more efficient LEDs may be seen with the development of the AlGaAs LED technology for the red portions of the visible spectrum. A similar continual need has been felt for LEDs that will emit in the green, blue and ultraviolet regions of the visible spectrum which ranges from 400 nanometers (nm) (3.10 eV) to 770 nm (1.61 ev). Because red, green, and blue are primary colors, their presence is necessary to produce full color displays or pure white light.

As mentioned above, the wavelength (s) of photons that can be produced by a given semiconductor material is a function of the material's bandgap ($E_g$). This relationship can be expressed as $s(nm)=1240/E_g(eV)$. Thus smaller bandgap materials produce lower energy, longer wavelength photons, while wider bandgap materials are required to produce higher energy, shorter wavelength photons. For example, one semiconductor commonly used for lasers is indium gallium aluminum phosphide (InGaAlP). This material's bandgap depends upon the mole or atomic fraction of each element present, and the light that InGaAlP can produce is limited to the yellow to red portion of the visible spectrum, i.e., about 560 to 700 nm.

In order to produce photons that have wavelengths in the green, blue or ultraviolet (UV) portions of the spectrum, semiconductor materials with relatively large bandgaps are required. Typical candidate materials include silicon carbide (6H—SiC with a bandgap of 2.5 eV) and alloys of indium nitride (InN with a bandgap of 1.9 eV), gallium nitride (GaN with a bandgap of 3.4 eV) and aluminum nitride (AlN with a bandgap of 6.2 eV). Since these nitrides can form solid solutions, the bandgap of these alloys (AlInGaN) can be tuned potentially from 1.9 eV to 6.2 eV with a corresponding wavelength varying from 653 nm to 200 nm at room temperature.

SUMMARY OF THE INVENTION

Aluminum indium gallium nitride (AlInGaN) is a very attractive LED candidate material for green, blue and UV wavelengths because of its relatively large bandgap at room temperature and because it is a direct bandgap material rather than an indirect bandgap material. Generally speaking, an LED formed in a direct bandgap material is more efficient than one formed in an indirect bandgap material because the recombination of carriers occurs directly without the help of phonons (lattice vibration) and the photon from the direct transition retains more energy than one from an indirect transition.

Because the bulk gallium nitride (hexagonal GaN; a=0.3189 nm, c=0.5185 nm) substrates are not readily available, AlInGaN layers are typically grown on a sapphire (hexagonal alpha-$Al_2O_3$; a=0.4578 nm, c=1.299 nm) or on a silicon carbide substrate (hexagonal 6H—SiC; a=0.308 nm, c=1.512 nm). The AlInGaN films grow by lattice matching epitaxy on 6H—SiC, and by domain matching epitaxy on sapphire. The AlInGaN growth on sapphire involves a 30/90 degree rotation in the basal plane, and 6/7 domain matching of the major planes between the film and the substrate. The differences in lattice constants and coefficients of thermal expansion between the film and the substrate cause misfit strains which result in high dislocation densities in AlInGaN layers, typically around $10^{10}$ cm$^{-2}$. When carriers (electrons and holes) are trapped by dislocations, they recombine non-radioactively without generating light.

In accordance with a first embodiment of the invention, an efficient optoelectronic device of the type which produces spontaneous emission by radiative recombination of carriers (electrons and holes) is formed of a layered quantum well (QW) structure in which the thickness of the QW layers varies periodically. It is believed that the thickness variations result in the formation of Quantum Confinement (QC) regions, which trap the carriers. If the QC regions are smaller than the separation between dislocations, the trapped carriers recombine radioactively and efficiently produce photons. In another embodiment, Al is added to InGaN to increase the wavelength to produce a $Al_yIn_xGa_{(1-x-y)}N$ Laser Device (LD) or multiquantum well (MQW) LED.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 8A is a schematic of the laser diode (LD) structure where the LD is grown on sapphire.

FIG. 8B is a schematic of the laser diode (LD) structure where the LD is grown on n GaN or SiC.

DETAILED DESCRIPTION OF THE INVENTION

A description of preferred embodiments of the invention follows.

In accordance with the invention, $In_xGa_{(1-x)}N$ based multiquantum well (MQW) light emitting diodes (LEDs) and laser devices having high optical efficiency, are fabricated in which the efficiency is related to the Thickness Variation (TV) of the $In_xGa_{(1-x)}N$ active layers. The thickness variation of active layers is found to be more important than the In composition fluctuation in quantum confinement (QC) of excitons (carriers) in these devices. In the invention, we have produced MQW $In_xGa_{(1-x)}N$ layers with a periodic thickness variation, which results in periodic fluctuation of bandgap for the quantum confinement of carriers. Detailed STEM-Z contrast analysis (where image contrast is proportional to $Z^2$ (atomic number)$^2$) was carried out to investigate the spatial distribution of In. We discovered that there is a longitudinal periodic variation in the thickness of $In_xGa_{(1-x)}N$ layers with two periods, one short-range (SR-TV, 3 to 4 nm) and other long-range thickness variations of (LR-TV, 50 to 100 nm). It was also found that the effect of variation in In concentration is considerably less than the effect of thickness variation in the LED structures which exhibit high optical efficiency. A comparative microstructural study between high and low optical efficiency MQW structures indicates that thickness variation of $In_xGa_{(1-x)}N$ active layers is the key to their enhancement in optical efficiency.

Figure 1:
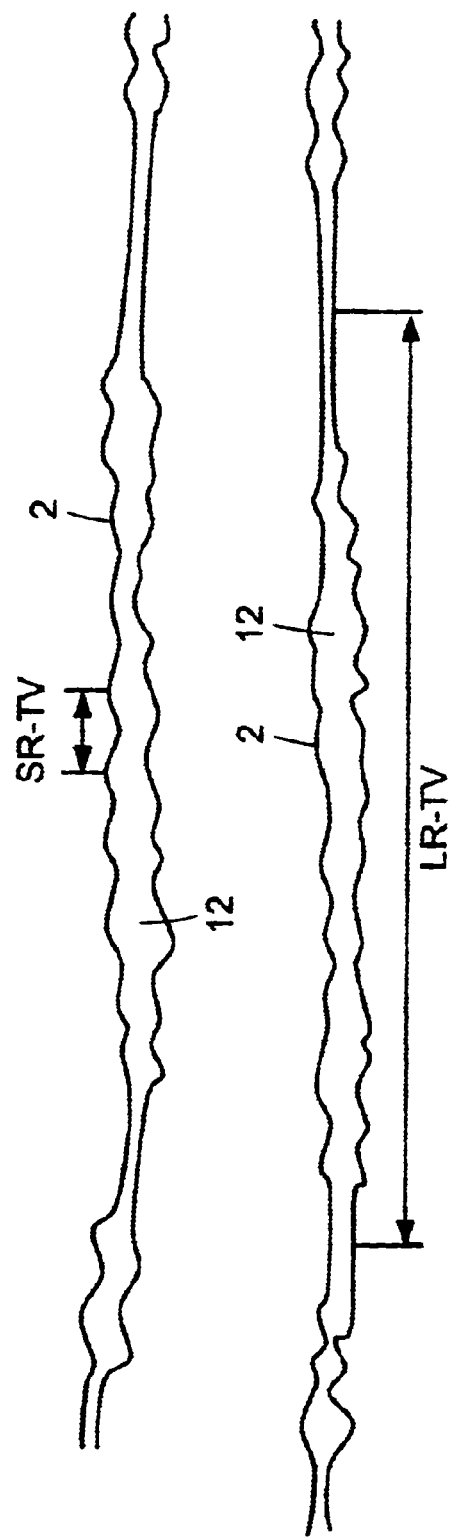
FIG. 1 is a schematic of Short-Range Thickness Variation (SR-TV) and Long-Range Thickness Variation (LR-TV) of a portion of the active GaN/InGaN quantum well superlatice layers in a high efficiency light emitting diode structure.

As shown in FIG. 1, QC regions 2 are formed within the boundaries of either LR-TV or SR-TV as a result of the thickness variations. The QC regions 2 trap the carriers, which recombine without being affected by the presence of stress induced dislocations. A detailed STEM-Z contrast analysis shows that the thickness variation of $In_xGa_{(1-x)}N$ layers 12 is more important then the In composition fluctuation in producing quantum confined regions for carriers, leading to enhanced optical efficiency of LEDs and LDs. The bandgap change is dictated by the thickness:

$$(L_z) \text{ via: } \Delta E_1 = h^2 n^2/(8m^* L_z^2) \tag{1},$$

where $E_1$ is the lowest allowed energy level, h is Planck's constant, and m* is effective mass.

Figure 2:
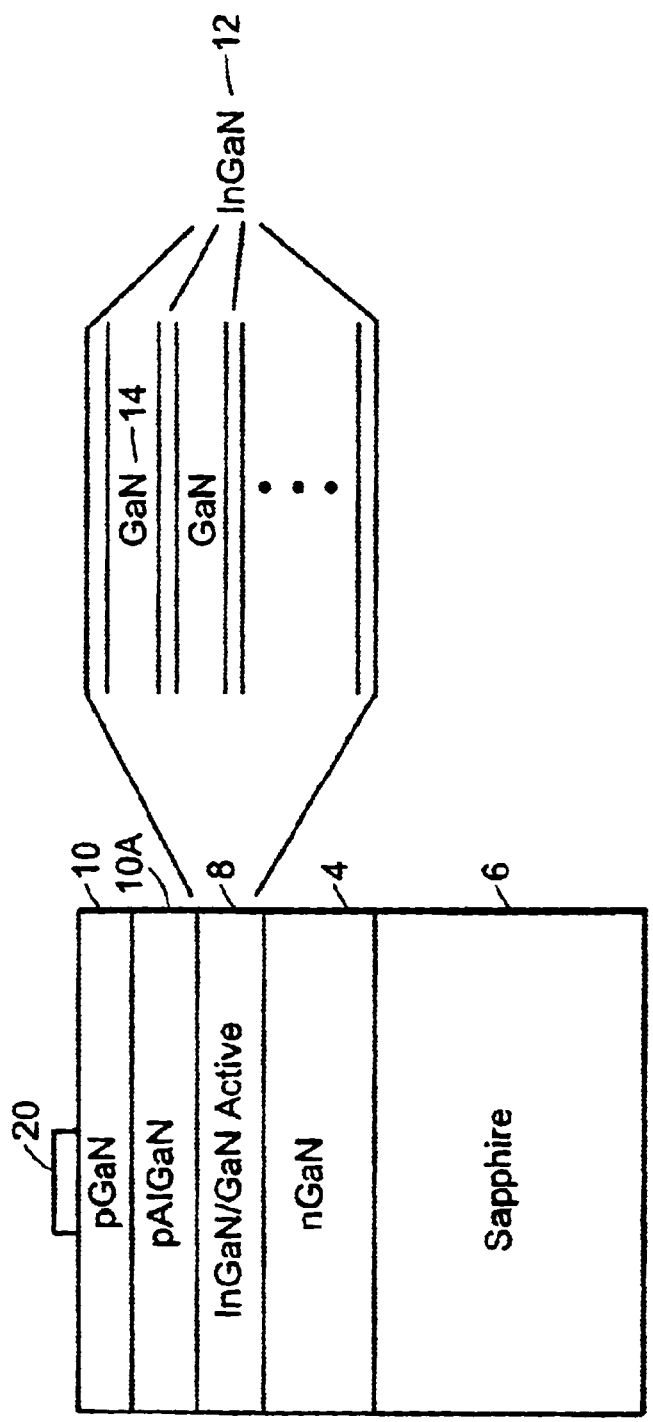
FIG. 2 is a schematic of showing details of the LED structure.

A schematic of an LED structure set forth in FIG. 2 is grown on a sapphire substrate 6 by means of metal-organic chemical vapor deposition (MOCVD). Sources for the growth are trimethylgallium, trimethylaluminum, trimethylindium are used as sources for group-III elements, ammonia for the nitrogen, disilane for the n-type doping and biscyclopentadienyl ($CP_2Mg$) for the p-type doping. First, a nucleation layer of AlGaInN 5–30 nm thick is grown at a temperature of ~500 C. Then Si-doped n-type GaN layer 4 (3–5 μm thick) is grown at a temperature between 1000 and 1050 C. Then an InGaN(12)/GaN MQW(14) structure 8 is grown at a temperature between 700 and 750 C for InGaN and 850 and 950 C for GaN. Then Mg-doped p-type GaN layer 10 is grown at a temperature between 950 and 1000 C. Optionally, Mg-doped p-type AlGaN layer 10A is grown between the MQW structure and p-type GaN at a temperature between 950 and 1000 C.

In order to create the thickness variation, the growth temperature of part of the n-type layer (~0.1 micron) near the active region is lowered. The preferred temperature range is between 880 and 920 C, while conventional growth temperature is between 1000 and 1050 C. Wafer A was grown under the preferred growth conditions, while wafer C was grown under the conventional growth temperature. (See FIG. 7).

We have analyzed the InGaN/GaN MQW structures using STEM-Z transmission electron microscopy (TEM), in which the image contrast is proportional to $Z^2$ (Z=atomic number). Since the atomic number of In (49) is much higher than that of Ga (31), the contrast due to In is enhanced by two and a half times compared to Ga, and the image contrast is dictated primarily by the In concentration.

Figure 3A:
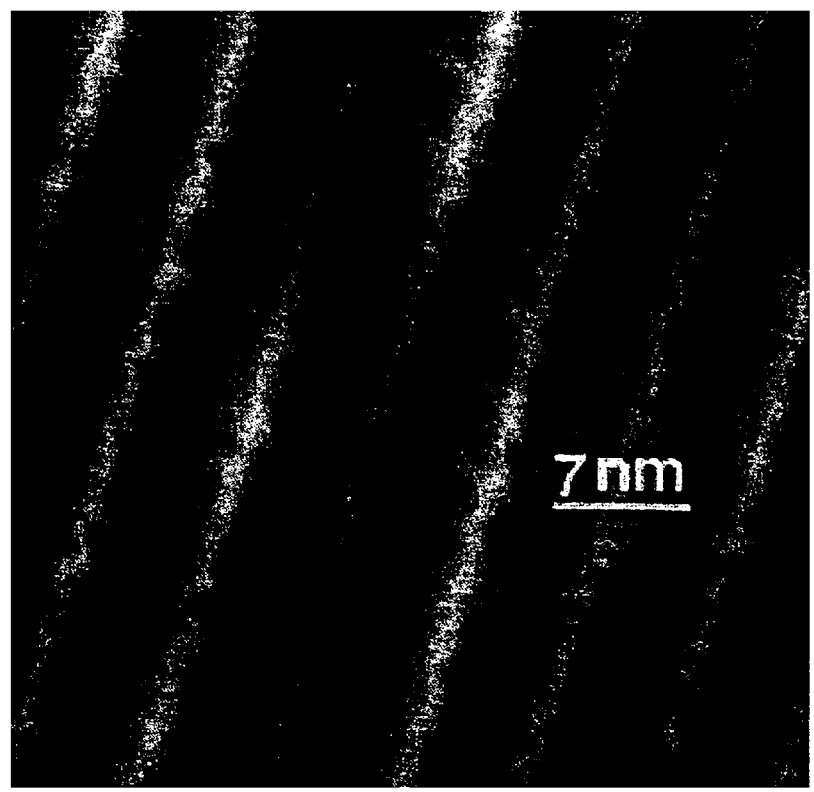
FIG. 3A is a scanning transmission electron microscopy-atomic number (STEM-Z) contrast image in cross-section showing short-range thickness variation in the active InGaN layer in a high efficiency LED structure.
Figure 3B:
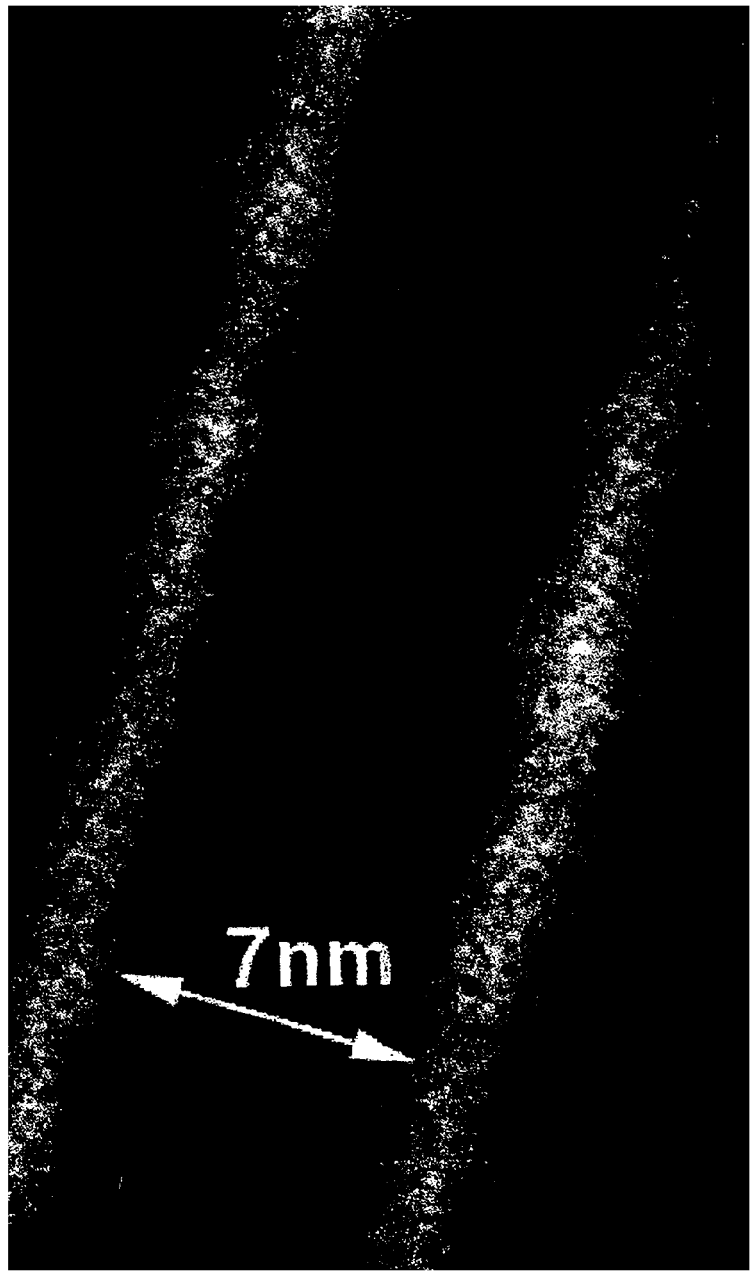
FIG. 3B is a enlargement of FIG. 3A.
Figure 4:
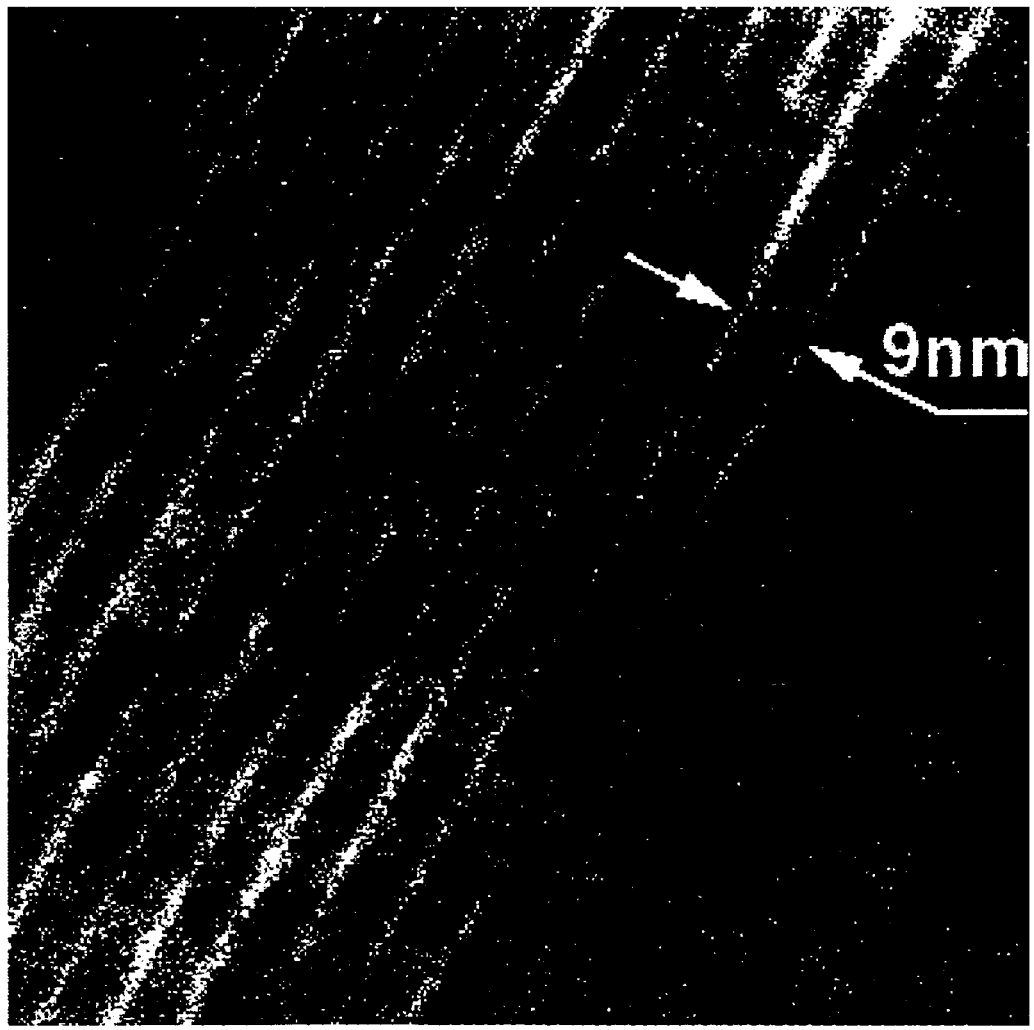
FIG. 4 is a STEM-Z contrast image in cross-section showing long-range thickness variation in all ten InGaN layers of a multiple-quantum-well (MQW) structure.
Figure 5A:
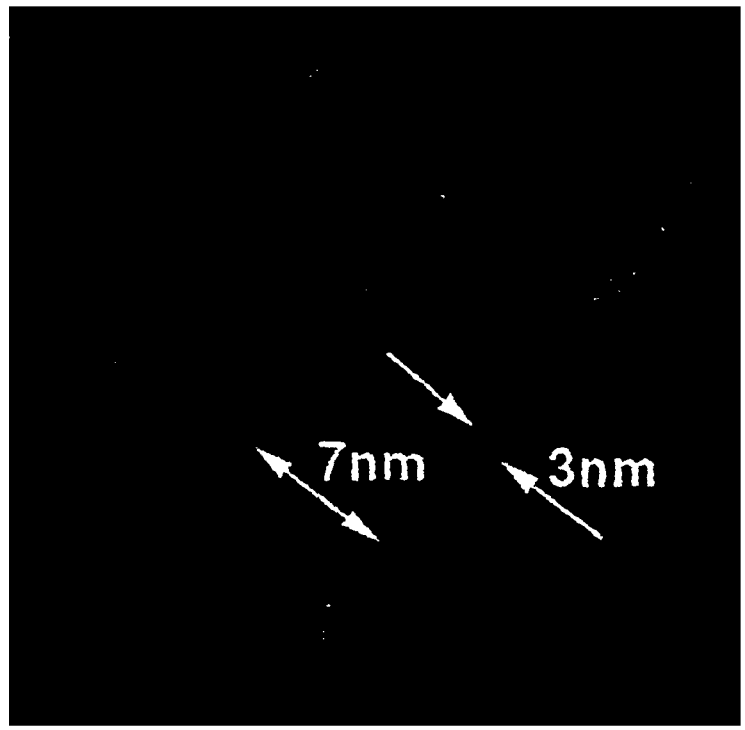
FIG. 5A is a STEM-Z contrast image of cross-section showing characteristic long-range thickness variation in a InGaN/GaN MQW structure from another high-efficiency LED wafer.
Figure 5B:
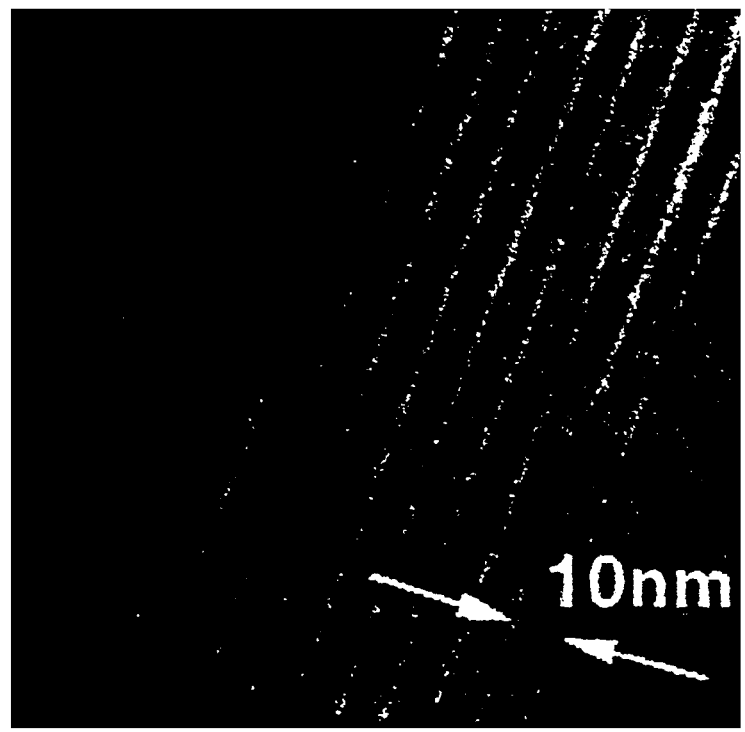
FIG. 5B is a STEM-Z contrast image of the cross-section showing the short-range thickness variation in a InGaN/GaN MQW structure (same wafer as FIG. 5A).

FIGS. 3–5 show STEM-Z contrast images in cross-section from two LED structures which exhibited high optical efficiencies. These specimens show short-range (3 to 4 nm period) and long-range (50 to 100 nm period) thickness variations in InGaN layers. This contrast analysis reveals that there are variations in In concentration, but they are not very large. In other embodiments, depending upon the growth of the structure, short-range thickness variations can range between 2 to 10 nm and long-range thickness variations can range between 50 and 200 nm.

Figure 6A:
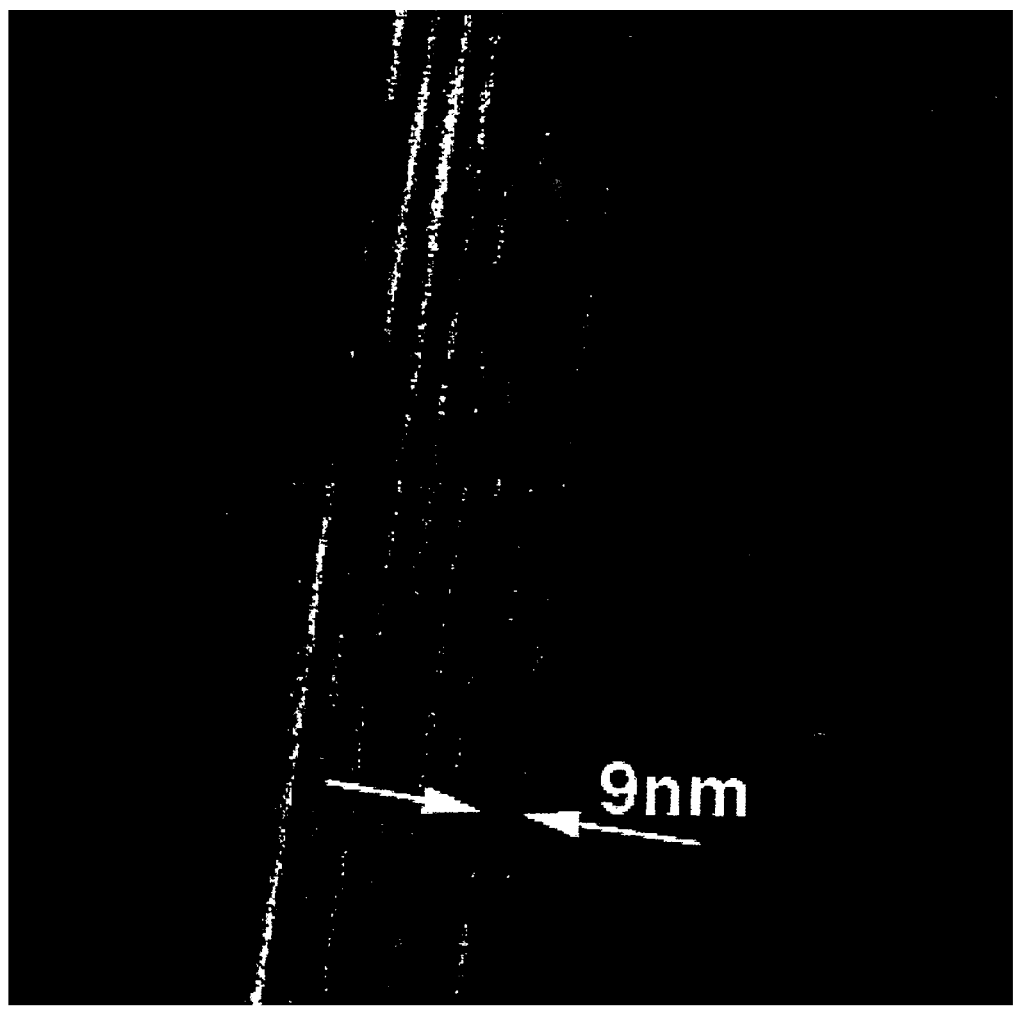
FIG. 6A is a STEM-Z contrast image showing uniform InGaN layers in a relative low efficiency LED structure.
Figure 6B:
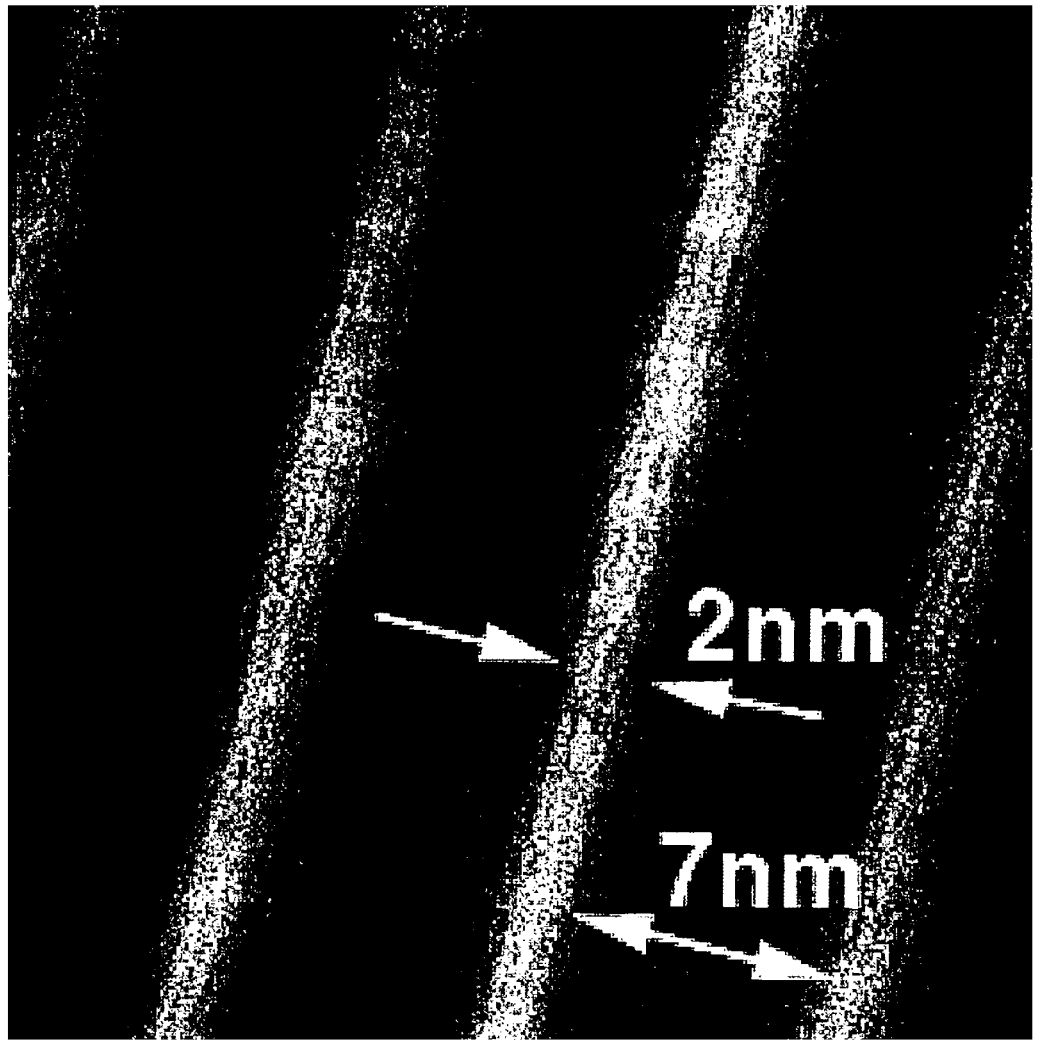
FIG. 6B is a enlargement if FIG. 6A.

In contrast to the high optical efficiency specimens (FIGS. 3–5), a specimen with relatively low optical efficiencies is shown in FIGS. 6A and 6B. In these specimens, where optical efficiencies are lower by a factor of two to three than those for the specimens in FIGS. 3–5, the superlattice thickness as well as indium concentration is quite uniform.

The change in bandgap of $In_xGa_{(1-x)}N$ alloys can occur as function of the composition 'x' and the thickness '$L_z$' of the superlattice. For a typical active layer composition (x=0.4), the change in bandgap is estimated to be as follows: x=0.4, bandgap=2.58 eV; x=0.5, bandgap=2.43 eV; x=0.3, bandgap=2.75 eV. This amounts to a +/−25% change (from x=0.4) in active layer composition. Experimentally observed composition fluctuations are less than +/−5%, which should lead to a less than 0.07 eV change in the bandgap. On the other hand, thickness variation from 3 to 2 nm can change the bandgap by more than 0.2 eV. Experimentally observed LR-TV is in the range of 20 to 50%, and SR-TV is less than 10%. Based on this analysis, we believe that the QC regions are defined principally by the thickness in InGaN layers.

Figure 7:
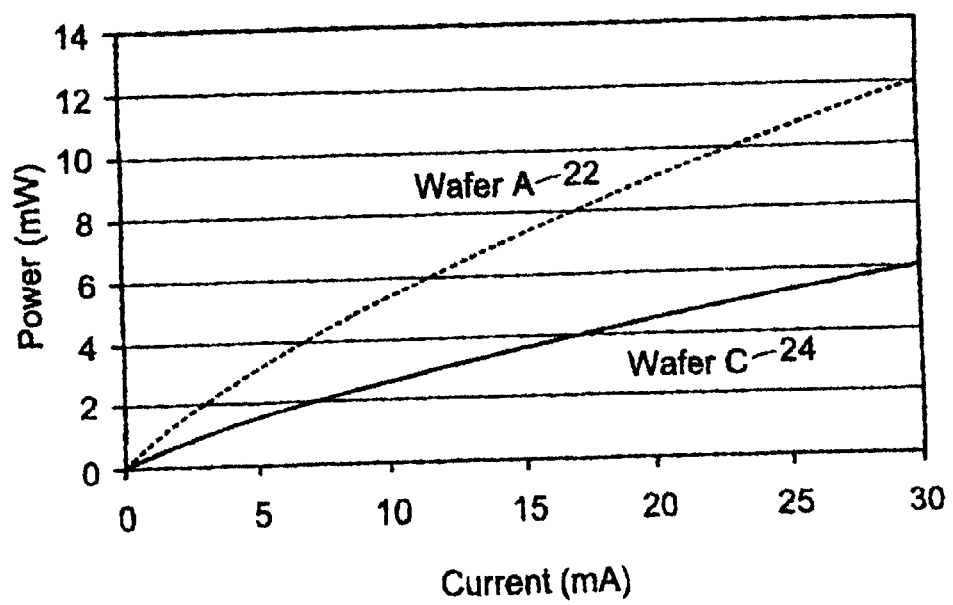
FIG. 7 is a comparison of output power from an LED with periodic thickness variation (A) and an LED with uniform thickness (C).

An LED is fabricated by forming an ohmic contact 20 on the top p-type GaN surface 10 of FIG. 2 and forming another contact on the n-type GaN surface 4 after it is exposed by etching the p-type GaN layer 10 and the active region 8. The light output power of LEDs from two such wafers is shown in FIG. 7. The output power of the LED from the specimen with InGaN thickness variation 22 is about a factor of 2–3 higher than that from the specimen with uniform InGaN thickness 24. Thus our experimental results on a comparative study of high- and low-efficiency LEDs demonstrate that thickness variation coupled with indium concentration variation is the key to enhancing the optical efficiencies in LEDs. We believe that the thickness variation is caused by two-dimensional strain in the $In_xGa_{(1-x)}N$ layer below its critical thickness. Since strain energy increases with thickness, the uniform thickness breaks into a periodic variation by which the free energy of the system can be lowered. Since the strain also increases with In concentration, some fluctuation in In concentration is also expected. This phenomenon of thickness variation has been well documented for pure germanium thin film growth on (100) silicon below its critical thickness where no composition fluctuation is involved references. We have modeled the thickness variation and derived the following relation for TV period ($\lambda$):

$$\lambda = \pi\gamma(1-v)/[2(1+v)^2\mu\epsilon^2] \quad (2),$$

where $\gamma$ is the surface energy, $v$ is the Poisson's ratio, $\mu$ is the shear modulus of the film, and $\epsilon$ is the strain normal to the film surface. To avoid non-radiative recombination at the dislocations (density $\rho$), we derive the optimum structure to be:

$$\rho^{-1/2} > \pi\gamma(1-v)/[2(1+v)^2\mu\epsilon^2] \quad (3)$$

or $$\rho < \{\pi\gamma(1-v)/[2(1+v)^2\mu\epsilon^2]\}^{-2} \quad (4).$$

We have estimated a typical value of $\lambda$ using the following parameters for our growth conditions. For $In_{0.4}Ga_{0.6}N$, shear modulus is estimated to be 82 Gpa, Poisson's ratio to be 0.3, surface energy 4,000 ergs/cm$^2$, and strain 2%. These values result in $\lambda$ of 80 nm, which is in good agreement with observed LR-TV. Since the period varies as $\epsilon^{-2}$, the large misfit strain initially could lead to observed SR-TV.

Although we have shown the formation of QC regions 2 due to thickness variation in InGaN, a similar effect can be obtained in AlInGaN for shorter wavelength LEDs. In this case, superlattice can be formed between AlInGaN and AlGaN or between AlInGaN layers with different alloy compositions.

The QC regions 2 can also be beneficial for laser diode fabrication. FIGS. 8A and 8B show the schematic of a LD structure 26. In order to form the waveguide, either AlGaN, AlGaN/GaN superlattice, or AlInGaN layers can be used for the cladding layers, and InGaN/GaN or AlInGaN/AlGaN MQWs can be used for the active layers. To facilitate the ohmic contacts, a p-type GaN or InGaN cap layer 28 is added on top of the p-type cladding layer 30. If the LD structure 26 is grown on an insulating substrate 6 such as sapphire, the n contacts 32 are formed after the n-type GaN layer 4 is exposed by etching the top layers. If it is grown on top of a conducting substrate 7 such as SiC or GaN, the n contacts 32 are formed on the bottom of the substrate. The fabrication of the laser is completed by forming feedback mirrors. This can be done either by cleaving the wafer perpendicular to the contact stripe or by etching vertical walls using anisotropic etching techniques.

While this invention has been particularly shown and described with references to preferred embodiments thereof, it will be understood by those skilled in the art that various changes in form and details may be made therein without departing from the scope of the invention encompassed by the appended claims.

What is claimed is:

1. An optoelectronic device comprising:

a substrate; and multiple quantum well (MQW) layers formed of Group III nitrides in which carriers recombine to emit photons, the layers being formed over the substrate and wherein the layers periodically vary in thickness along a continuous length thereof.

2. The device of claim 1, wherein the layers have stress induced dislocations and the thickness variations result in the formation of quantum confinement regions which are smaller than separations between the stress induced dislocations.

3. The device of claim 2, wherein the quantum confinement regions trap the carriers, which recombine to produce the photons for efficient spontaneous emissions.

4. The device of claim 1, including contacts formed on the device and a voltage source coupled to the contacts to enable the device to operate as a high efficiency LED.

5. The device of claim 1, including a feedback mirror to produce coherent light.

6. The device of claim 1 in which the MQWs are formed of layers of $In_xGa_{(1-x)}N$ and GaN.

7. The device of claim 1 in which the MQWs are formed of layers of $Al_yIn_xGa_{(1-x-y)}N$ and $Al_zGa_{(1-z)}N$.

8. The device of claim 1 in which the substrate is formed of a compound from the class of $Al_2O_3$, Si, SiC, GaN or AlN or alloys thereof.

9. The device of claim 1 in which the thickness variation is a relatively short longitudinal range on the order of 2 to 10 nanometers (nm).

10. The device of claim 9 having an additional long-range thickness variation in the order of 50 to 200 nm and thickness variation more than 10%.

11. The device of claim 9 having an additional long-range thickness variation more than 10%.

12. The device of claim 9 having a long-range thickness variation period less than the separation of dislocations.

13. An LED comprising:

a substrate; and multiple quantum well (MQW) layers formed of Group III nitrides in which carriers recombine to emit photons, the layers being formed over the substrate and wherein the layers periodically vary in thickness along a continuous length thereof.

14. The device of claim 13, wherein the layers have stress induced dislocations and the thickness variations result in the formation of quantum confinement regions which are smaller than separations between the stress induced dislocations.

15. The device of claim 13, wherein the quantum confinement regions trap the carriers, which recombine to produce the photons for efficient spontaneous emission.

16. The LED of claim 13, wherein the substrate is formed of $Al_2O_3$, the quantum well layers are formed of InGaN/GaN, an n GaN is formed between the $Al_2O_3$ and quantum well layers, and a p GaN is formed over the quantum well layers.

* * * * *

UNITED STATES PATENT AND TRADEMARK OFFICE
CERTIFICATE OF CORRECTION

PATENT NO. : 6,881,983 B2
DATED : April 19, 2005
INVENTOR(S) : Jagdish Narayan et al.

It is certified that error appears in the above-identified patent and that said Letters Patent is hereby corrected as shown below:

Column 6,
Line 66, insert the following

-- 17. An optoelectronic device comprising:

a substrate; and multiple quantum well (MQW) layers formed of Group III nitrides in which carriers recombine to emit photons, the layers being formed over the substrate and wherein the layers periodically vary in thickness along a length thereof, where the layers have stress induced dislocations and the thickness variations result in the formation of quantum confinement regions which are smaller than separations between the stress induced dislocations.

18. The device of claim 17, wherein the quantum confinement regions trap the carriers, which recombine to produce the photons for efficient spontaneous emissions.

19. An optoelectronic device comprising:

a substrate; and multiple quantum well (MQW) layers formed of Group III nitrides in which carriers recombine to emit photons, the layers being formed over the substrate and wherein the layers periodically vary in thickness along a length thereof, where the thickness variation is a relatively short longitudinal range on the order of 2 to 10 nanometers (nm).

20. The device of claim 19, having an additional long-range thickness variation in the order of 50 to 200nm and thickness variation more than 10%.

21. The device of claim 19, having an additional long-range thickness variation more than 10%.

UNITED STATES PATENT AND TRADEMARK OFFICE
CERTIFICATE OF CORRECTION

PATENT NO. : 6,881,983 B2
DATED : April 19, 2005
INVENTOR(S) : Jagdish Narayan et al.

It is certified that error appears in the above-identified patent and that said Letters Patent is hereby corrected as shown below:

<u>Column 6 (cont'd)</u>,

22. The device of claim 19, having a long-range thickness variation period less than the separation of dislocations.

23. An LED comprising:
   a substrate; and
   multiple quantum well (MQW) layers formed of Group III nitrides in which carriers recombine to emit photons, the layers being formed over the substrate and wherein the layers periodically vary in thickness along a length thereof, where the layers have stress induced dislocations and the thickness variations result in the formation of quantum confinement regions which are smaller than separations between the stress induced dislocations.

24. The device of claim 23, wherein the quantum confinement regions trap the carriers, which recombine to produce the photons for efficient spontaneous emission. - -

Signed and Sealed this

Twenty-eighth Day of June, 2005

JON W. DUDAS
*Director of the United States Patent and Trademark Office*